United States Patent
Cheng et al.

(10) Patent No.: US 10,923,503 B2
(45) Date of Patent: Feb. 16, 2021

(54) SEMICONDUCTOR-ON-INSULATOR (SOI) SUBSTRATE COMPRISING A TRAP-RICH LAYER WITH SMALL GRAIN SIZES

(71) Applicant: Taiwan Semiconductor Manufacturing Co., Ltd., Hsin-Chu (TW)

(72) Inventors: Yu-Hung Cheng, Tainan (TW); Cheng-Ta Wu, Shueishang Township (TW); Yeur-Luen Tu, Taichung (TW); Min-Ying Tsai, Kaohsiung (TW); Alex Usenko, St Louis, MO (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 164 days.

(21) Appl. No.: 16/024,962

(22) Filed: Jul. 2, 2018

(65) Prior Publication Data

US 2020/0006385 A1    Jan. 2, 2020

(51) Int. Cl.
*H01L 21/8238* (2006.01)
*H01L 21/336* (2006.01)
(Continued)

(52) U.S. Cl.
CPC .... *H01L 27/1203* (2013.01); *H01L 21/02532* (2013.01); *H01L 21/02592* (2013.01);
(Continued)

(58) Field of Classification Search
CPC .......... H01L 27/1203; H01L 21/02532; H01L 21/02592; H01L 21/02667;
(Continued)

(56) References Cited

U.S. PATENT DOCUMENTS 6,066,547 A * 5/2000 Maekawa ........... H01L 21/2022
                                                              438/486
6,974,747 B2 * 12/2005 Park ..................... H01L 21/2022
                                                              438/257
(Continued)

OTHER PUBLICATIONS

Shim, et al. "RF MEMS Passives on High-Resistivity Silicon Substrates." IEEE Microwave and Wireless Components Letters. Published in 2013.
(Continued)

*Primary Examiner* — Alonzo Chambliss
(74) *Attorney, Agent, or Firm* — Eschweiler & Potashnik, LLC

(57) ABSTRACT

Various embodiments of the present application are directed towards a method for forming a semiconductor-on-insulator (SOI) substrate comprising a trap-rich layer with small grain sizes, as well as the resulting SOI substrate. In some embodiments, an amorphous silicon layer is deposited on a high-resistivity substrate. A rapid thermal anneal (RTA) is performed to crystallize the amorphous silicon layer into a trap-rich layer of polysilicon in which a majority of grains are equiaxed. An insulating layer is formed over the trap-rich layer. A device layer is formed over the insulating layer and comprises a semiconductor material. Equiaxed grains are smaller than other grains (e.g., columnar grains). Since a majority of grains in the trap-rich layer are equiaxed, the trap-rich layer has a high grain boundary area and a high density of carrier traps. The high density of carrier traps may, for example, reduce the effects of parasitic surface conduction (PSC).

20 Claims, 11 Drawing Sheets

(51) Int. Cl.
*H01L 21/331* (2006.01)
*H01L 21/76* (2006.01)
*H01L 21/70* (2006.01)
*H01L 27/12* (2006.01)
*H01L 21/02* (2006.01)
*H01L 29/16* (2006.01)
*H01L 21/762* (2006.01)
*H01L 21/84* (2006.01)
*H01L 29/04* (2006.01)
*H01L 29/20* (2006.01)
*H01L 29/22* (2006.01)
*H01L 29/24* (2006.01)
*H01L 29/26* (2006.01)
*H01L 31/09* (2006.01)

(52) U.S. Cl.
CPC .. *H01L 21/02667* (2013.01); *H01L 21/76254* (2013.01); *H01L 21/84* (2013.01); *H01L 29/04* (2013.01); *H01L 29/16* (2013.01); *H01L 29/1604* (2013.01); *H01L 29/2006* (2013.01); *H01L 29/2206* (2013.01); *H01L 29/247* (2013.01); *H01L 29/263* (2013.01); *H01L 31/095* (2013.01)

(58) Field of Classification Search
CPC ... H01L 21/76254; H01L 21/84; H01L 29/04; H01L 29/16; H01L 29/263; H01L 29/1604; H01L 29/2006; H01L 29/2206; H01L 29/247; H01L 31/095; H01L 31/0058
See application file for complete search history.

(56) References Cited

U.S. PATENT DOCUMENTS

| | | | |
|---|---|---|---|
| 9,240,496 B2 * | 1/2016 | Okhonin | G11C 11/404 |
| 9,515,139 B2 * | 12/2016 | Arriagada | H01L 21/268 |
| 9,691,871 B1 * | 6/2017 | Caubet | H01L 21/28088 |
| 2012/0091587 A1 * | 4/2012 | Or-Bach | H01L 23/49827 257/741 |
| 2013/0084689 A1 * | 4/2013 | Arriagada | H01L 21/76243 438/478 |
| 2014/0175449 A1 * | 6/2014 | Kasahara | H01L 27/3262 257/72 |
| 2015/0249053 A1 * | 9/2015 | Or-Bach | H01L 23/5386 257/401 |
| 2015/0287783 A1 * | 10/2015 | Arriagada | H01L 21/7806 438/459 |
| 2017/0004873 A1 * | 1/2017 | Cai | G11C 29/50004 |
| 2018/0166318 A1 * | 6/2018 | Dutartre | H01L 21/0245 |
| 2018/0304206 A1 * | 10/2018 | Striemer | B81C 1/00119 |
| 2019/0164834 A1 * | 5/2019 | Or-Bach | H01L 23/5252 |

OTHER PUBLICATIONS

Ali, et al. "Impact of Crosstalk into High Resistivity Silicon Substrate on the RF Performanc of SOI MOSFET." Journal of Telecommunications and Information Technology. Apr. 2010.

Ploessl, et al. "Silicon-on-Insulator: Materials Aspects and Applications." Solid-State Electronics 44 (2000) 775±782.

Prasad, Hari, "Solidification of Metals." Retrieved online on Mar. 16, 2018 from https://www.slideshare.net/SachinHariprasad/solidification-of-metals-by-hari-prasad.

Sun, et al. "Spike Anneal Qualification for 0.13 um USJ Technology on Radiance Entura." 9th Int. Conference on Advanced Thermal Processing of Semiconductors—RTP'2001.

Ali, Khale, Substrate-Related RF Performance of Trap-Rich High-Resistivity SOI.Universite Catholique de Louvain. Jun. 2014.

Esfeh, et al. "RF SOI CMOS Technology on 1st and 2nd Generation Trap-Rich High Resistivity SOI Wafers." Solid-State Electronics 128 (2017) 121-128.

* cited by examiner

SEMICONDUCTOR-ON-INSULATOR (SOI) SUBSTRATE COMPRISING A TRAP-RICH LAYER WITH SMALL GRAIN SIZES

BACKGROUND

Integrated circuits (ICs) have traditionally been formed on bulk semiconductor substrates. In recent years, semiconductor-on-insulator (SOI) substrates have emerged as an alternative to bulk semiconductor substrates. An SOI substrate comprises a handle substrate, an insulating layer overlying the handle substrate, and a device layer overlying the insulating layer. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
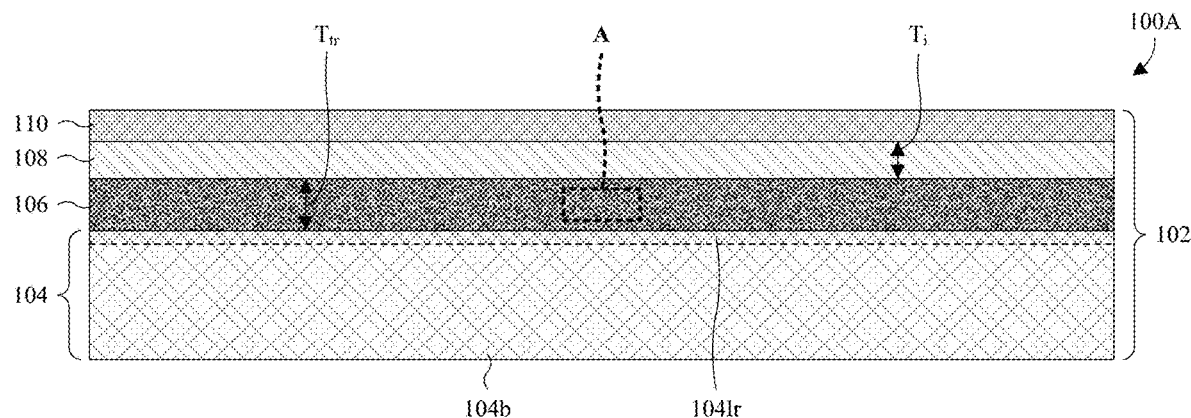
FIG. 1A illustrates a cross-sectional view of some embodiments of a semiconductor-on-insulator (SOI) substrate comprising a trap-rich layer with small grain sizes.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Semiconductor-on-insulator (SOI) substrates are often used for radio frequency (RF) applications. Such an SOI substrate may comprise a high-resistivity substrate, an insulating layer overlying the high-resistivity substrate, and a device layer overlying the insulating layer. Among other things, the high resistivity of the high-resistivity substrate may reduce RF losses, reduce crosstalk, and increase linearity. However, since the high-resistivity substrate is typically silicon, the high-resistivity substrate may suffer from parasitic surface conduction (PSC). Fixed charge in the insulating layer attracts mobile electrons in the high-resistivity substrate, thereby creating a low-resistivity region along a top surface of the high-resistivity substrate.

Because the low-resistivity region has a low resistivity, the low-resistivity region at least partially negates the benefits of the high-resistivity substrate. RF signals (e.g., from devices on the SOI substrate) may induce the formation of eddy currents in the low-resistivity region. The eddy currents dissipate the RF signals and lead to RF losses, whereby passive devices may have low Q factors. Further, the eddy currents reflect the RF signals, thereby increasing crosstalk and reducing linearity (e.g., increasing second harmonics).

To counteract the effects of the low-resistivity region, a trap-rich layer of polysilicon may be placed between the high-resistivity substrate and the insulating layer. Grain boundaries of the trap-rich layer serve as carrier traps for the mobile electrons, thereby reducing PSC. However, the trap-rich layer is typically formed by slow heating amorphous silicon at high temperatures into polysilicon, whereby the trap-rich layer has large columnar grains. The high temperatures improve throughput but do so at the expense of large grain sizes. Due to the large columnar grains, the trap-rich layer has a low grain boundary area and hence a low trap density, which limits the effectiveness of the trap-rich layer at reducing PSC. Additionally, the trap-rich layer is typically formed by a single-wafer epitaxial tool, whereby throughput is low.

Various embodiments of the present application are directed towards a SOI substrate comprising a trap-rich layer with small grain sizes, as well as the SOI substrate resulting from the method. In some embodiments, an amorphous silicon layer is deposited on a high-resistivity substrate. A rapid thermal anneal (RTA) is performed to crystallize the amorphous silicon layer into a trap-rich layer of polysilicon in which a majority of grains are equiaxed. An insulating layer is formed over the trap-rich layer. A device layer is formed over the insulating layer and comprises a semiconductor material.

Equiaxed grains are smaller than other grains (e.g., columnar grains). Since a majority of grains in the trap-rich layer are equiaxed, the trap-rich layer has a high grain boundary area and a high density of carrier traps. The high density of carrier traps may, for example, reduce the effects of PSC. By reducing the effects of PSC, the SOI substrate promotes low RF losses, passive device with high Q factors, low crosstalk, and high linearity (e.g., low second harmonics). The small grain sizes of the trap-rich layer also reduce stress on the high-resistivity substrate. The reduced stress reduces substrate warpage and bowing, and further reduces dislocations and slips at edges of the high-resistivity substrate. This, in turn, may enhance yields during bulk manufacture of the SOI substrate. Further, the reduced stress enhances gate oxide integrity (GOI) for at least some devices formed on the SOI substrate, whereby yields may be enhanced during bulk manufacture of devices on the SOI substrate.

With reference to FIG. 1A, a cross-sectional view 100A of some embodiments of a SOI substrate 102 is provided. The SOI substrate 102 may, for example, be used for RF applications and/or other applications. In some embodiments, the SOI substrate 102 has a circular top layout and/or has a diameter of about 200, 300, or 450 millimeters. In other embodiments, the SOI substrate 102 has some other shape and/or some other dimensions. Further, in some embodiments, the SOI substrate 102 is a semiconductor wafer (e.g., a bulk silicon wafer). The SOI substrate 102 comprises a high-resistance substrate 104, a trap-rich layer 106, an insulating layer 108, and a device layer 110.

The high-resistance substrate 104 comprises a bulk semiconductor region 104*b* and a low-resistivity region 104*lr*. For ease of illustration, the hashing has been varied between the bulk semiconductor region 104*b* and the low-resistivity region 104*lr*. The high-resistance substrate 104 may be or comprise, for example, monocrystalline silicon, some other silicon material, some other semiconductor material, or any combination of the foregoing.

The bulk semiconductor region 104*b* underlies the low-resistivity region 104*lr* and has a high resistance compared to the low-resistivity region 104*lr*. The high resistance reduces substrate losses, which improves the Q factor of passive devices (not shown) on the SOI substrate 102. The high resistance may, for example, be greater than about 1, 3, 4, or 10 kilo-ohms/centimeter (kΩ/cm), and/or may, for example, be between about 1-4 kΩ/cm, about 4-10 kΩ/cm, or about 1-10 kΩ/cm. In some embodiments, the high-resistance substrate 104 is lightly doped with p-type or n-type dopants to achieve the high resistance. The low-resistivity region 104*lr* extends along a top surface of the high-resistance substrate 104 and forms due to PSC. Fixed charge in the insulating layer 108 attracts mobile electrons in the high-resistivity substrate 104, thereby creating the low-resistivity region 104*lr*.

The trap-rich layer 106 overlies the high-resistance substrate 104 and is or comprises polysilicon. A high percentage of the trap-rich layer 106 is defined by equiaxed grains, whereas a low percentage of the trap-rich layer 106 is defined by columnar grains. The high percentage may, for example, be greater than about 80, 90, 95, or 99 percent, and/or the low percentage may, for example, be less than about 20, 10, 5, or 1 percent. The percentages may, for example, be by total area of the trap-rich layer 106, total number of grains in the trap-rich layer 106, or some other metric. The columnar grains are large elongated grains, such that the columnar grains have a low grain boundary area. The equiaxed grains are small grains with approximately equal dimensions, such that the equiaxed grains have high grain boundary area. Because the equiaxed grains make up a large percentage of the trap-rich layer 106, the trap-rich layer 106 has high grain boundary area and a high density of carrier traps.

The carrier traps trap the mobile electrons forming the low-resistivity region 104*lr*, thereby reducing the size of the low-resistivity region 104*lr* and reducing the effect of PSC. Further, due to the high density of carrier traps, the carrier traps trap a substantial amount of the mobile electrons, whereby the low-resistivity region 104*lr* is small. Accordingly, eddy currents induced in the low-resistivity region 104*lr* by RF signals are substantially reduced. By substantially reducing the eddy currents, RF losses may be low and passive devices on the SOI substrate 102 may have high Q factors. Further, by substantially reducing the eddy currents, linearity is high (e.g., second harmonics are low) and crosstalk is low. Accordingly, the trap-rich layer 106 enhances the SOI substrate 102 for use with RF applications and other applications.

In some embodiments, a thickness $T_{tr}$ of the trap-rich layer 106 is between about 1-2 micrometers, about 1.0-1.5 micrometers, or about 1.5-2.0 micrometers. If the thickness $T_{tr}$ is too small (e.g., less than about 1.0 micrometer), the trap-rich layer 106 may be ineffective at trapping mobile electrons and reducing the effect of PSC. If the thickness $T_{tr}$ is too large (e.g., greater than about 2.0 micrometers), the SOI substrate 102 may be prone to a high amount of substrate warpage. The high amount of substrate warpage may lead to poor GOI and dislocations at the edges of SOI substrate 102, whereby yields may be low.

The insulating layer 108 overlies the trap-rich layer 106 and may be or comprise, for example, silicon oxide, silicon-rich oxide (SRO), some other oxide, silicon carbide, silicon nitride, some other dielectric, or any combination of the foregoing. In some embodiments, a thickness $T_i$ of the insulating layer 108 is between about 0.1-2 micrometers, about 0.1-1.0 micrometers, about 1.0-1.5 micrometers, or about 1.5-2.0 micrometers. Further, in some embodiments, the insulating layer 108 has a total thickness variation (TTV) that is low and less than about 10, 25, or 50 nanometers. The TTV may be low due to, for example, the small equiaxed grains in the trap-rich layer 106. The small equiaxed grains cause the trap-rich layer 106 to have a top surface that is relatively smooth, whereby the insulating layer 108 may be formed (e.g., by thermal oxidation) with the low TTV.

The device layer 110 overlies the insulating layer 108 and may, for example, be or comprise monocrystalline silicon, some other silicon, some other semiconductor material, or any combination of the foregoing. In some embodiments, the device layer 110 is or comprises the same semiconductor material as the high-resistance substrate 104. As seen hereafter, the device layer 110 may, for example, support semiconductor devices and/or an interconnect structure. The semiconductor devices may be, for example, metal-oxide-semiconductor field-effect transistors (MOSFETs) or some other semiconductor devices.

Figure 1B:
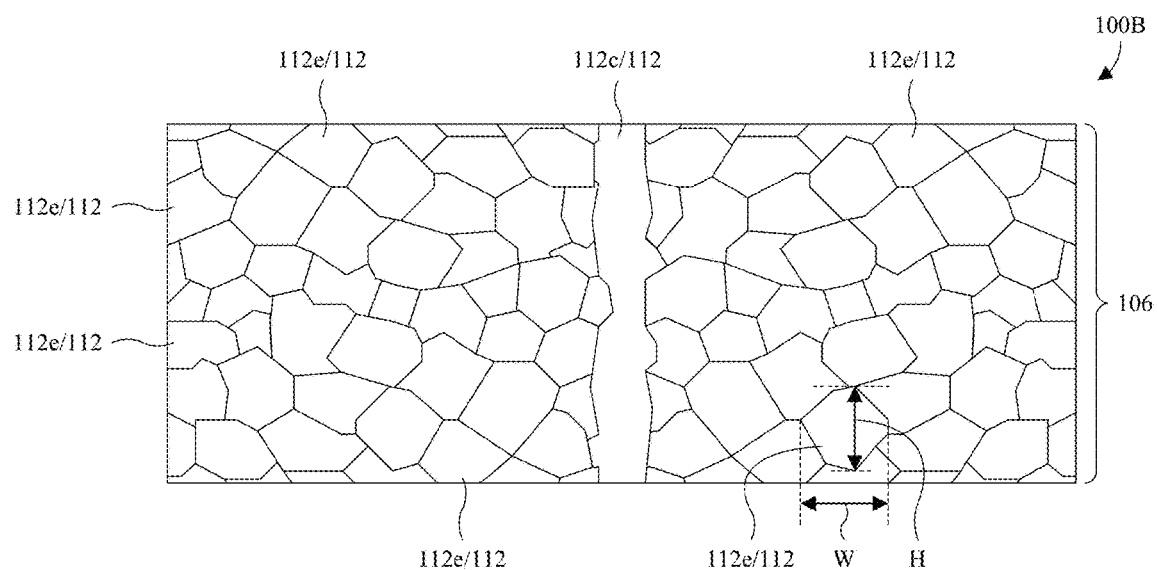
FIG. 1B illustrates an enlarged cross-sectional view of some embodiments of the trap-rich layer of FIG. 1A.

With reference to FIG. 1B, an enlarged cross-sectional view 100B of some embodiments of the trap-rich layer 106 of FIG. 1A is provided. The enlarged cross-sectional view 100B may, for example, be taken within box A in FIG. 1A and may, for example, be representative of a remainder of the trap-rich layer 106. The trap-rich layer 106 comprises a plurality of grains 112. For ease of illustration, only some of the grains 112 are labeled 112. The grains 112 define grain boundaries along which carrier traps concentrate. As noted above, the carrier traps trap mobile electrons forming the low-resistivity region 104lr of FIG. 1A, thereby reducing the size of the low-resistivity region 104lr.

The plurality of grains 112 comprise equiaxed grains 112e and, in some embodiments, further comprise columnar grains 112c. For ease of illustration, only some of the equiaxed grains 112e are labeled 112. The equiaxed grains 112e may, for example, make up more than about 80, 90, 95, or 99 percent of the trap-rich layer 106, and/or may, for example, make up between about 80-90, 90-95, or 95-99 percent of the trap-rich layer 106. The columnar grains 112c may, for example, make up less than about 20, 10, 5, or 1 percent of the trap-rich layer 106, and/or may, for example, make up between about 10-20, about 5-10, or about 1-5 percent of the trap-rich layer 106. The percentages for the equiaxed and columnar grains 112e, 112c may, for example, be by total area of the trap-rich layer 106, by total number of grains in the trap-rich layer 106, or by some other metric. In some embodiments, the grains 112 have individual widths W and/or individual depths (not shown) that are between about 10-100 nanometers, about 10-50 nanometers, or about 50-100 nanometers, and/or that are less than about 100 nanometers, about 50 nanometers, or about 10 nanometers. Note that the individual depths extend into and out of the page and are hence not visible within FIG. 1B.

The equiaxed grains 112e are small grains with approximately equal dimensions, such that the equiaxed grains 112e have high grain boundary area. In some embodiments, an equiaxed grain 112e has approximately equal dimensions if all dimensions of the equiaxed grain 112e (e.g., height H, width W, and depth D) are within about 30, 20, or 10 percent of the average of the dimensions (e.g., (H+W+D)/3). In some embodiments, one, some, or all of the dimensions of the equiaxed grains 112e is/are between about 10-100 nanometers, about 10-50 nanometers, or about 50-100 nanometers. For example, a maximum dimension of the equiaxed grains 112e may be between one of these ranges. Further, in some embodiments, one (e.g., a maximum dimension), some, or all of the dimensions of the equiaxed grains 112e is/are less than about 100, 50, or 10 nanometers. For example, a maximum dimension of the equiaxed grains 112e may be less than one or more of these thresholds.

The columnar grains 112c are large elongated grains, such that the columnar grains have a low grain boundary area compared to the equiaxed grains 112e. In some embodiments, a columnar grain 112c is elongated if lateral dimensions of the columnar grain 112c (e.g., width W and depth D) are within about 30, 20, or 10 percent of the average of the lateral dimensions (e.g., (W+D)/2) and a vertical dimension of the columnar grain 112c (e.g., height H) is about 2, 5, 10, or 20 times the average of the lateral dimensions. In some embodiments, one (e.g., a maximum lateral dimension) or all of the lateral dimensions of the columnar grains 112c is/are between about 10-100 nanometers, about 10-50 nanometers, or about 50-100 nanometers. For example, a maximum dimension may be between one of these ranges.

Figure 2:
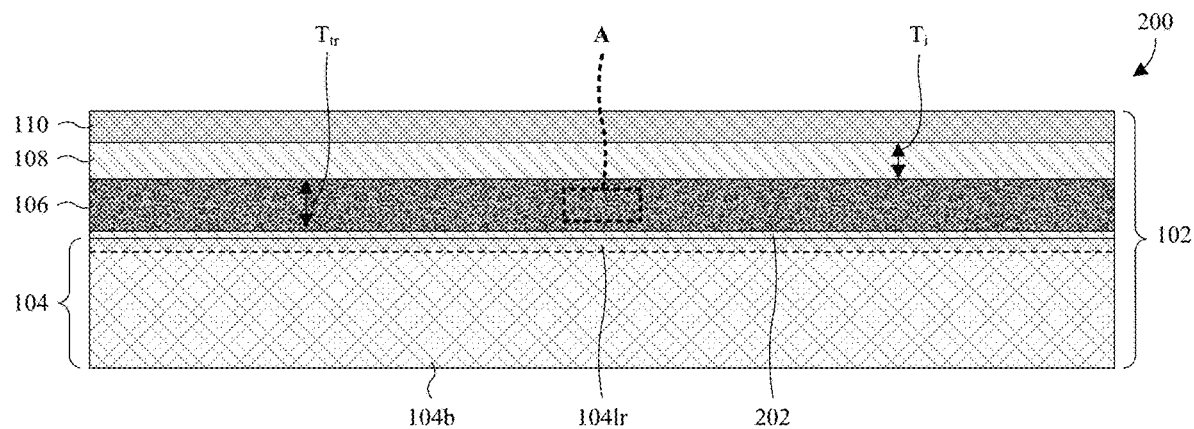
FIG. 2 illustrates a cross-sectional view of some alternative embodiments of the SOI substrate of FIG. 1A in which a barrier layer separates the trap-rich layer from a high-resistivity substrate.

With reference to FIG. 2, a cross-sectional view 200 of some alternative embodiments of the SOI substrate 102 of FIG. 1A is provided in which a barrier layer 202 is between the trap-rich layer 106 and the high-resistivity substrate 104. The barrier layer 202 may, for example, be silicon oxide, some other oxide, some other dielectric material, or any combination of the forgoing. As seen hereafter, the barrier layer 202 may, for example, facilitate formation of the trap-rich layer 106 using, among other things, an epitaxy tool.

Figure 3:
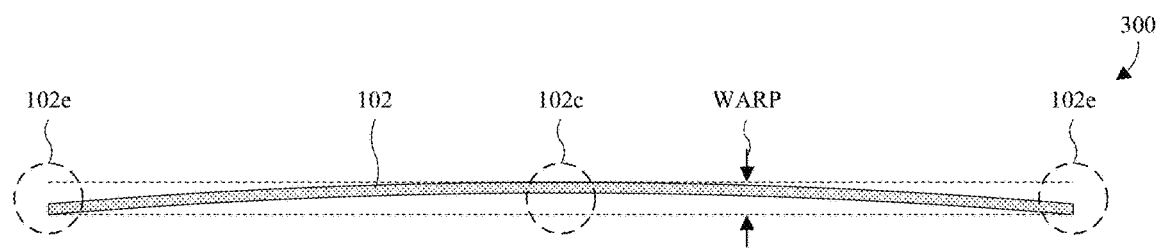
FIG. 3 illustrates a cross-sectional view of the SOI substrate of FIG. 1A in which the SOI substrate is subject to substrate warpage.

With reference to FIG. 3, a cross-sectional view 300 of some embodiments of the SOI substrate 102 of FIG. 1A is provided in which the SOI substrate 102 has substrate warpage WARP. The substrate warpage WARP is the separation between the lowest point on the SOI substrate 102 and the highest point on the SOI substrate 102. In some embodiments, the lowest and highest points on the SOI substrate 102 correspond to the center 102c of the SOI substrate 102 and the edges 102e of the SOI substrate 102, or vice versa. The substrate warpage WARP may, for example, occur due to different crystalline lattices and/or coefficients of thermal expansion between the various layers of the SOI substrate 102 (see FIG. 1A).

As seen hereafter, by forming the trap-rich layer 106 with a RTA, substrate warpage WARP is minimized. By minimizing substrate warpage WARP, the SOI substrate 102 is under less stress and is less prone to slips (i.e., dislocations) at the edges 102e of the SOI substrate 102. Further, by minimizing substrate warpage WARP, the GOI of semiconductor devices (not shown) formed on the SOI substrate 102 may be improved. The improved GOI and the reduction in substrate stress, in turn, leads to higher yields (e.g., during bulk manufacture of the SOI substrate 102 and/or during bulk manufacture of devices on the SOI substrate 102).

Figure 4:
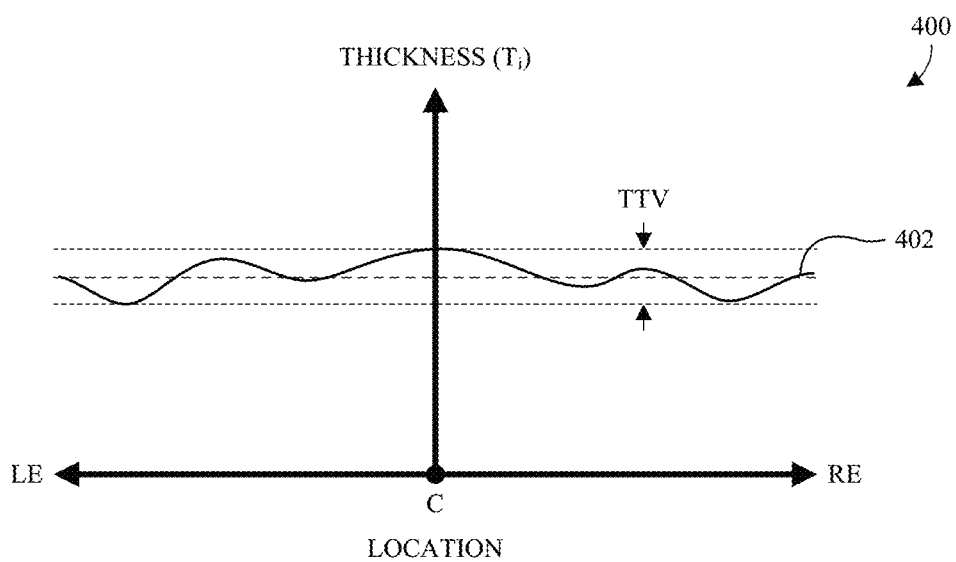
FIG. 4 illustrates a graph of some embodiments of a thickness curve for an insulating layer of the SOI substrate of FIG. 1A.

With reference to FIG. 4, a graph 400 illustrates a thickness curve 402 for some embodiments of the insulating layer 108 of FIG. 1A. The thickness curve 402 describes thickness $T_i$ of the insulating layer 108 as a function of location along the insulating layer 108. Further, the thickness curve 402 begins at a left edge LE of the insulating layer 108 and extends past a center C of the insulating layer 108 to a right edge RE of the insulating layer 108.

As illustrated, the thickness curve 402 has a TTV that is low. The TTV is the difference between the smallest thickness along the thickness curve 402 and the largest thickness along the thickness curve 402. The TTV may, for example, be low due to the high amount of small equiaxed grains in the trap-rich layer 106. The high amount of small equiaxed grains results in the trap-rich layer 106 having a top surface that is smooth, whereby the insulating layer 108 is formed (e.g., by thermal oxidation) with the low TTV. The TTV may, for example, be low in that it is less than about 10, 25, or 50 nanometers, and/or between about 5-50 nanometers, about 5-25 nanometers, or about 25-50 nanometers.

Figure 5:
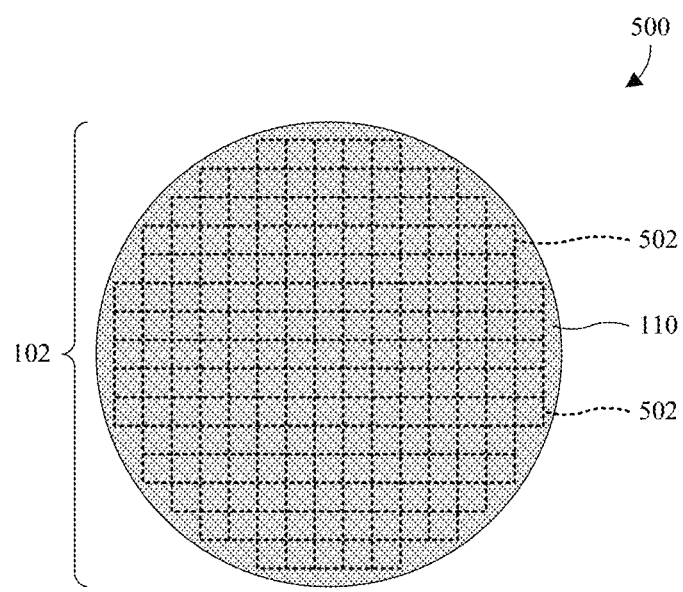
FIG. 5 illustrates a top view of some embodiments of the SOI substrate of FIG. 1A.

With reference to FIG. 5, a top view 500 of some embodiments of the SOI substrate 102 of FIG. 1A is provided. As illustrated, the SOI substrate 102 is a circular wafer and comprises multiple IC dies 502 arranged in a grid across the device layer 110. For ease of illustration, only some of the IC dies 502 are labeled 502. In some embodiments, each of the IC dies 502 has the same IC and/or each of the IC dies 502 comprises a plurality of semiconductor devices.

Figure 6:
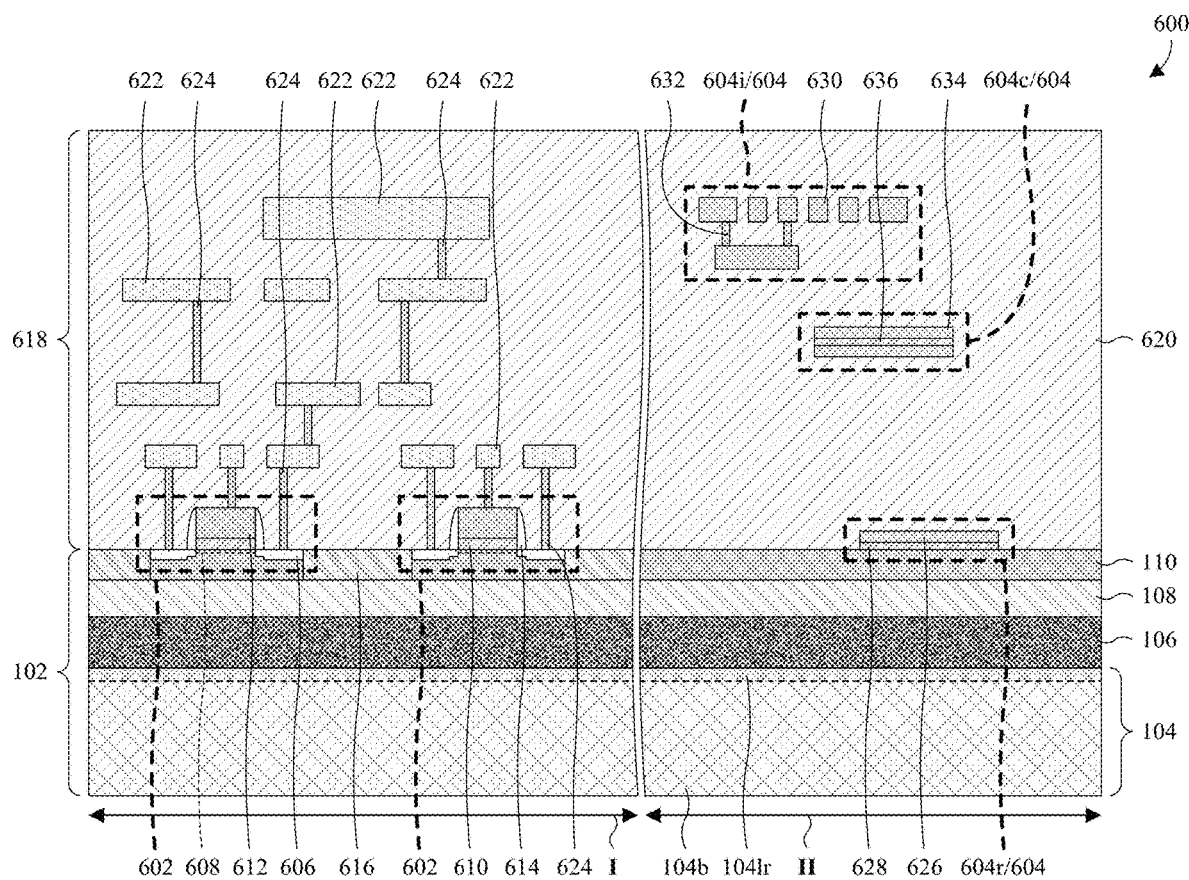
FIG. 6 illustrates a cross-sectional view of some embodiments of a semiconductor structure in which the SOI substrate of FIG. 1A finds application.

With reference to FIG. 6, a cross-sectional view 600 of some embodiments of a semiconductor structure in which the SOI substrate 102 of FIG. 1A finds application is provided. The semiconductor structure comprises a plurality of active devices 602 at a first portion I of the semiconductor substructure, and further comprises a plurality of passive devices 604 at a second portion II of the semiconductor structure. The first portion I of the semiconductor structure may, for example, be used for logic applications, whereas the second portion II of the semiconductor substrate may, for example, be used for RF applications.

The active devices 602 are laterally spaced over and partially defined by the device layer 110. The active devices 602 may be, for example, MOSFETs, some other metal-oxide semiconductor (MOS) devices, some other insulated-gate field-effect transistors (IGFETs), some other semiconductor devices, or any combination of the foregoing. In some embodiments, the active devices 602 comprise corresponding source/drain regions 606, corresponding selectively-conductive channels 608, corresponding gate dielectric layers 610, corresponding gate electrodes 612, and corresponding spacers 614. For ease of illustration, only one of the source/drain regions 606 is labeled 606, only one of the selectively-conductive channels 608 is labeled 608, only one of the gate dielectric layers 610 is labeled 610, only one of the gate electrodes 612 is labeled 612, and only one of the spacers 614 is labeled 614.

The source/drain regions 606 and the selectively-conductive channels 608 are in the device layer 110. The source/drain regions 606 are respectively at ends of the selectively-conductive channels 608, and each of the selectively-conductive channels 608 extends from one of the source/drain regions 606 to another one of the source/drain regions 606. The source/drain regions 606 have a first doping type and directly adjoin portions of the device layer 110 having a second doping type opposite the first doping type. The gate dielectric layers 610 respectively overlie the selectively-conductive channels 608, and the gate electrodes 612 respectively overlie the gate dielectric layers 610. The gate dielectric layers 610 may be or comprise, for example, silicon oxide and/or some other dielectric material, and/or the gate electrodes 612 may be or comprise, for example, doped polysilicon, metal, some other conductive material, or any combination of the foregoing. The spacers 614 overlie the source/drain regions 606 and respectively line sidewalls of the gate electrodes 612 and sidewalls of the gate dielectric layers 610. The spacers 614 may be or comprise, for example, silicon oxide, silicon nitride, silicon oxynitride, silicon carbide, some other dielectric, or any combination of the foregoing.

In some embodiments, isolation structures 616 separate the active devices 602 and demarcate device regions of the device layer 110 that are individual to the active devices 602. For ease of illustration, only one of the isolation structures 616 are labeled 616. The isolation structures 616 may be or comprise, for example, shallow trench isolation (STI) structures, deep trench isolation (DTI) structures, some other trench isolation structures, or some other isolation structures. In some embodiments, the isolation structures 616 extend completely through the device layer 110 to the insulating layer 108 for enhanced electrical isolation between the active devices 602. Further, in some embodiments, the isolation structures 616 comprise a dielectric material, such as, for example, silicon oxide and/or some other dielectric material.

A back-end-of-line (BEOL) interconnect structure 618 covers the SOI substrate 102 and the active devices 602. The BEOL interconnect structure 618 comprises an interconnect dielectric layer 620, a plurality of wires 622, and a plurality of vias 624. For ease of illustration, only some of the wires 622 are labeled 622, and only some of the vias 624 are labeled 624. The interconnect dielectric layer 620 may be or comprise, for example, phosphor-silicate glass (PSG), undoped silicon glass (USG), some other low κ dielectric, silicon oxide, some other dielectric, or any combination of the foregoing. As used herein, a low κ dielectric may be or comprise, for example, a dielectric with a dielectric constant κ less than about 3.9, 3, 2, or 1.

The wires 622 and the vias 624 are alternatingly stacked in the interconnect dielectric layer 620 and define conductive paths extending to the active devices 602 and the passive devices 604. Note that the conductive paths are only shown extending to the active devices 602 for ease of illustration. The conductive paths may, for example, electrically couple the active devices 602 and/or the passive devices 604 to other devices (e.g., other active devices and/or other passive devices), contact pads, or some other structures. The wires 622 and the vias 624 may be or comprise, for example, copper, aluminum copper, aluminum, tungsten, some other metal, or any combination of the foregoing. In some embodiments, topmost wires of the wires 622 are thicker than underlying wires of the wires 622.

The passive devices 604 comprise a passive resistor 604r, a passive inductor 604i, a passive capacitor 604c, or any combination of the foregoing. Further, in some embodiments, the passive devices 604 include a transmission line (not shown). The passive devices 604 may, for example, be employed for RF applications of the SOI substrate 102, and the trap-rich layer 106 may, for example, improve a Q factor of the passive devices 604 by reducing cross talk and improving linearity (e.g., reducing second harmonics).

In some embodiments, the passive resistor 604r is between the SOI substrate 102 and the BEOL interconnect structure 618. In some embodiments, the passive resistor 604r comprises a resistive layer 626 and a resistor dielectric layer 628 stacked on the device layer 110. The resistive layer 626 may, for example, be or comprise doped polysilicon or some other conductive material with the desired resistance. In some embodiments in which the resistive layer 626 is or comprises doped polysilicon, a doping concentration of the doped polysilicon is varied to control the resistance of the resistive layer 626. The resistor dielectric layer 628 may, for example, be or comprise silicon oxide, some other dielectric material, or any combination of the foregoing.

In some embodiments, the passive inductor 604i is in the BEOL interconnect structure 618 and/or comprises one or more inductor wires 630. For ease of illustration, only one of the inductor wire(s) 630 is labeled 630. In some embodiments, the inductor wire(s) 630 span multiple heights above the SOI substrate 102 and one or more inductor vias 632 interconnect the inductor wire(s) 630 across the multiple heights. For ease of illustration, only one of the inductor via(s) 632 is labeled 632. The inductor wire(s) and the inductor via(s) 632 may be or comprise, for example, copper, aluminum copper, aluminum, tungsten, some other metal, or any combination of the foregoing.

In some embodiments, the passive capacitor 604c is in the BEOL interconnect structure 618 and/or comprises a pair of capacitor plates 634 and a capacitor dielectric layer 636. For ease of illustration, only one of the capacitor plates 634 is labeled 634. The capacitor plates 634 and the capacitor dielectric layer 636 are stacked with the capacitor dielectric layer 636 between the capacitor plates 634. The capacitor plates 634 may be or comprise, for example, copper, aluminum copper, aluminum, tungsten, some other metal, or any combination of the foregoing. The capacitor dielectric layer 636 may be or comprise, for example, silicon dioxide, some other dielectric material, or any combination of the foregoing.

While FIGS. 3-6 are illustrated and described using embodiments of the SOI substrate 102 in FIG. 1A, it is to be appreciated that embodiments of the SOI substrate 102 in FIG. 2 may also be used. For example, the barrier layer 202 of FIG. 2 may arranged between the high-resistivity substrate 104 and the trap-rich layer 106 in FIG. 6 in some embodiments.

With reference to FIGS. 7, 8A, and 9-17, a series of cross-sectional views 700, 800A, 900-1700 of some embodiments of a method for forming and using an SOI substrate comprising a trap-rich layer with small grain sizes is provided. The method may, for example, be performed to form the SOI substrate of FIG. 1A or 2, and/or may, for example, use the SOI substrate to form the semiconductor structure of FIG. 6.

Figure 7:
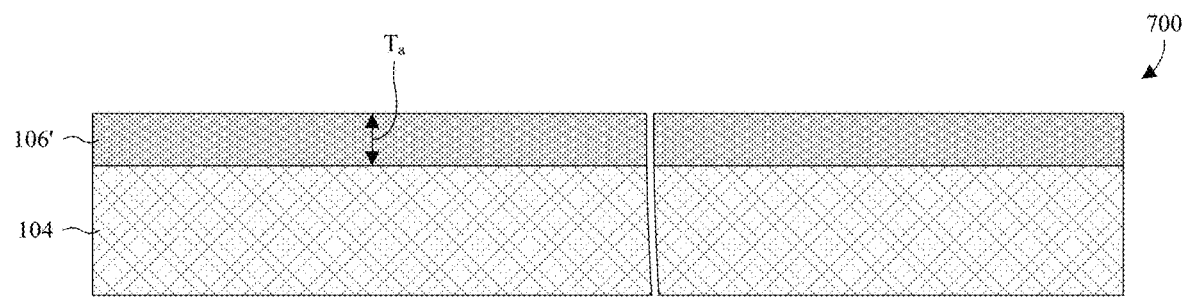
FIGS. 7, 8A, and 9-17 illustrate a series of cross-sectional views of some embodiments of a method for forming and using an SOI substrate comprising a trap-rich layer with small grain sizes.

As illustrated by the cross-sectional view 700 of FIG. 7, a high-resistance substrate 104 is provided. In some embodiments, the high-resistance substrate 104 has a circular top layout and/or has a diameter of about 200, 300, or 450 millimeters. In other embodiments, the high-resistance substrate 104 has some other shape and/or some other dimensions. Further, in some embodiments, the high-resistance substrate 104 is a semiconductor wafer (e.g., a bulk silicon wafer). The high-resistance substrate 104 has a high resistance and may be or comprise, for example, monocrystalline silicon, some other silicon material, some other semiconductor material, or any combination of the foregoing.

The high resistance of the high-resistance substrate 104 reduces substrate losses, which improves the Q factor of passive devices (not shown) hereafter formed on the SOI substrate being formed. The high resistance may, for example, be greater than about 1, 3, 4, or 10 kΩ/cm, and/or may, for example, be between about 1-4 kΩ, about 4-10 kΩ, or about 1-10 kΩ. In some embodiments, the high-resistance substrate 104 is lightly doped with p-type or n-type dopants to achieve the high resistance. Such light doping may, for example, be performed by ion implantation or some other doping process.

Also illustrated by the cross-sectional view 700 of FIG. 7, an amorphous silicon layer 106' is formed on the high-resistance substrate 104. The amorphous silicon layer 106' may, for example, be formed by chemical vapor deposition (CVD), physical vapor deposition (PVD), some other deposition process, or any combination of the foregoing. In some embodiments, the amorphous silicon layer 106' is formed at temperatures less than about 600, 550, or 500 degrees Celsius (° C.) to prevent crystallization of the amorphous silicon layer 106'.

In some embodiments, the amorphous silicon layer 106' is formed in an epitaxial reactor. In some of such embodiments, a barrier layer (not shown) is formed on the high-resistance substrate 104 before forming the amorphous silicon layer 106' so the epitaxial reactor forms amorphous silicon instead of monocrystalline silicon. An example of the barrier layer is shown in FIG. 2 with regard to element 202. The epitaxial reactor may, for example, be limited to processing a single substrate at a time. The barrier layer may, for example, be or comprise silicon oxide and/or may, for example, be formed while cleaning the high-resistivity substrate 104. The cleaning may, for example, be performed by a RCA clean process or some other clean process. In some embodiments, the amorphous silicon layer 106' is formed by a low pressure CVD (LPCVD) process tool. In some of such embodiments, the amorphous silicon layer 106' may be formed on the high-resistance substrate 104 and multiple other high-resistance substrates at the same time to enhance throughput during bulk formation of the SOI substrate.

In some embodiments, a thickness $T_a$ of the amorphous silicon layer 106' is between about 1-2 micrometers, about 1.0-1.5 micrometers, or about 1.5-2.0 micrometers. If the thickness $T_a$ is too small (e.g., less than about 1.0 micrometer), a trap-rich layer hereafter formed from the amorphous silicon layer 106' will be ineffective at reducing PSC. If the thickness $T_a$ is too large (e.g., greater than about 2.0 micrometers), the SOI substrate 102 will be prone to a high amount of substrate warpage. The high amount of substrate warpage will lead to poor GOI and dislocations at the edges of SOI substrate 102, whereby yields may be low.

Figure 8A:
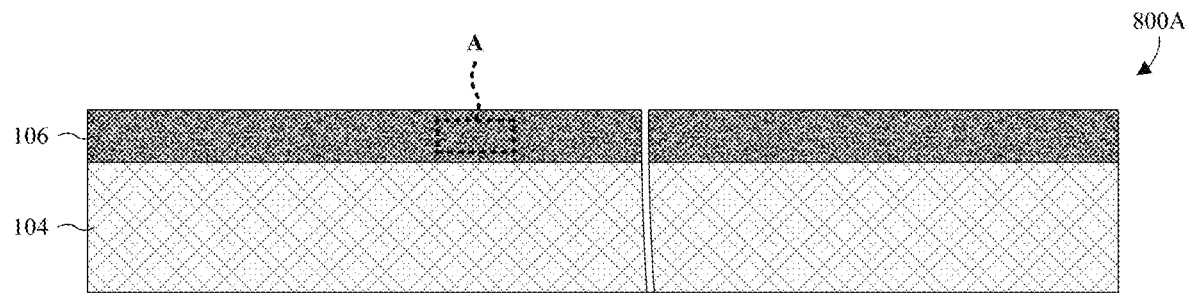

As illustrated by the cross-sectional view 800A of FIG. 8A, a rapid thermal anneal (RTA) is performed on the amorphous silicon layer 106' (see FIG. 7) to convert the amorphous silicon layer 106' to a trap-rich layer 106 of polycrystalline silicon. The RTA ramps up to a peak temperature above about 600° C. at a ramp-up rate that is fast, persists at the peak temperature for a short period of time, and ramps down from the peak temperature at a ramp-down rate to crystallize the amorphous silicon layer 106' in bulk nucleation mode.

The peak temperature may, for example, be about 1000° C., between about 600-1500° C., between about 600-1000° C., or between about 1000-1500° C. The ramp-up rate may, for example, be at or above about 75, 250, or 1000° C. per second, and/or may, for example, be between about 75-250° C., about 250-625° C., or about 625-1000° C. The ramp-down rate may, for example, be at or above 75, 90, 250, or 1000° C. per second, and/or may, for example, be between about 75-250° C., about 250-625° C., or about 625-1000° C. In some embodiments, the ramp-down rate and the ramp-up rate are the same. In some embodiments, the ramp-down rate is less than or greater than the ramp-up rate. The short period of time at the peak temperature may, for example, be less than or about 0.001, 1, 5, 10, 20, or 30 seconds, and/or may, for example, be about 0.001-1 seconds, about 1-10 seconds, or about 10-30 seconds.

Figure 8B:
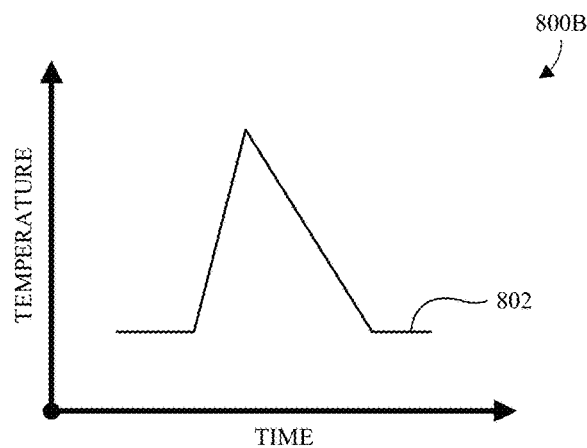
FIG. 8B illustrates a graph of some embodiments of a temperature curve for a thermal process performed at FIG. 8A.

In some embodiments, the RTA follows a spiked temperature curve 802 illustrated by a graph 800B of FIG. 8B. In some embodiments, the amorphous silicon layer 106' is preheated to a pre-heat temperature before the RTA. The pre-heat temperature may, for example, be between about 400-550° C., about 400-500° C., or about 500-550° C. In some embodiments, the RTA ramps up to the peak temperature from the pre-heat temperature, and/or the RTA ramps down from the peak temperature to the pre-heat temperature.

In some embodiments, a process for performing the RTA comprises preheating the amorphous silicon layer 106' to about 500° C., ramping up heating of the amorphous silicon layer 106' at about 75° C. per second until about 1000° C. is reached, heating the amorphous silicon layer 106' at about 1000° C. for about 10 seconds, and ramping down heating of the amorphous silicon layer 106'. In other embodiments, a process for performing the RTA comprises preheating the amorphous silicon layer 106' to about 500° C., ramping up heating of the amorphous silicon layer 106' at about 1000° C. per second until about 1000 degrees Celsius, heating the amorphous silicon layer 106' at about 1000 degrees Celsius for about 1 millisecond, and ramping down heating of the amorphous silicon layer 106'.

By crystallizing the amorphous silicon layer 106' in bulk nucleation mode, a high percentage of the trap-rich layer 106 is equiaxed grains and a low percentage of the trap-rich layer 106 is columnar grains. Examples of the equiaxed and columnar grains are shown and described with regard to FIG. 1B, which may, for example, be taken within box A of FIG. 8A. The high percentage may, for example, be greater than about 80, 90, 95, or 99 percent, and/or the low percentage may, for example, be less than about 20, 10, 5, or 1 percent. The percentages may, for example, be by total area of the trap-rich layer 106, total number of grains in the trap-rich layer 106, or some other metric. If the ramp-up rate during the RTA is slow (e.g., less than about 75° C.), bulk nucleation mode may not take over and the trap-rich layer 106 may instead have a high percentage of columnar grains and a low percentage of equiaxed grains.

The columnar grains are large elongated grains, such that the columnar grains have a low grain boundary area and a low trap density. The equiaxed grains are small grains with approximately equal dimensions, such that the equiaxed grains have a high grain boundary area and a high trap density. Because the equiaxed grains make up a large percentage of the trap-rich layer 106, the trap-rich layer 106 has high grain boundary area and a high density of carrier traps. As seen hereafter, the high density of carrier traps reduces PSC. Further, because the equiaxed grains make up a large percentage of the trap-rich layer 106, the trap-rich layer 106 mostly has small grains. This, in turn, reduces stress imposed on the high-resistivity substrate 104 by the trap-rich layer 106. The reduced stress reduces substrate warpage and bow, and further reduces dislocations and/or slips at edges of the high-resistivity substrate 104, to enhance GOI of devices hereafter formed and yields during bulk manufacture.

In some embodiments, dimensions (e.g., width, height, and depth) of the equiaxed grains and/or lateral dimensions of the columnar grains (e.g., width and depth) are between about 10-100 nanometers, about 10-50 nanometers, or about 50-100 nanometers, and are less than about 100 nanometers, about 50 nanometers, or about 10 nanometers. For example, a maximum dimension of the equiaxed grains and/or a maximum lateral dimension of the columnar grains may be between one of these ranges. In some embodiments, one, some, or all of the equiaxed grains each has approximately equal dimensions, where the approximately equal dimensions (e.g., height H, width W, and depth D) are within about 30, 20, or 10 percent of the average of the approximately equal dimensions (e.g., (H+W+D)/3). In some embodiments, one, some, or all of the columnar grains each has approximately equal lateral dimensions, wherein the approximately equal lateral dimensions (e.g., width W and depth D) are within about 30, 20, or 10 percent of the average of the lateral dimensions (e.g., (W+D)/2). In some embodiments, one, some, or all of the columnar grains each has a vertical dimension (e.g., height) that is about 2, 5, 10, or 20 times the average of the lateral dimensions. In some embodiments, grains of the trap-rich layer 106 are smallest at a bottom of the trap-rich layer 106.

Figure 9:
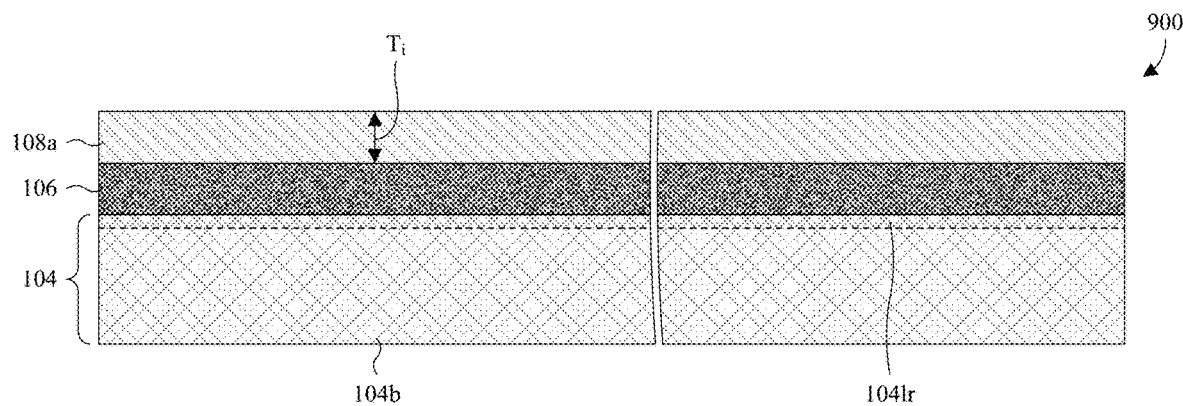

As illustrated by the cross-sectional view 900 of FIG. 9, a first insulating layer 108a is formed on the trap-rich layer 106. The first insulating layer 108a may, for example, be silicon oxide, silicon nitride, some other dielectric, or any combination of the foregoing. Further, the first insulating layer 108a may, for example, be formed by CVD, PVD, thermal oxidation, or some other deposition process. Because a large percentage of the trap-rich layer 106 is small equiaxed grains, a top surface of the trap-rich layer 106 is relatively smooth. As a result, the first insulating layer 108a has a thickness $T_i$ that is substantially uniform and a TTV that is low.

After and/or while forming the first insulating layer 108a, PSC may lead to the formation of a low-resistivity region 104lr in the high-resistivity substrate 104. For example, fixed charge in the first insulating layer 108a may attract mobile electrons in the high-resistivity substrate 104, thereby creating the low-resistivity region 104lr. The low-resistivity region 104lr overlies a bulk semiconductor region 104b of the high-resistivity substrate 104 and extends along a top surface of the high-resistivity substrate 104. Further, the low-resistivity region 104lr has a low resistance compared to the bulk semiconductor region 104b.

Because a high percentage of the trap-rich layer 106 is small equiaxed grains, the trap-rich layer 106 has a high density of carrier traps. Further, because of the high density of carrier traps, the carrier traps trap a substantial amount of the mobile electrons, whereby the low-resistivity region 104lr is small. Accordingly, eddy currents induced in the low-resistivity region 104lr by RF signals are substantially reduced. By substantially reducing the eddy currents, RF losses may be low and passive devices hereafter formed may have high Q factors. Further, by substantially reducing the eddy currents, linearity is high (e.g., second harmonics are low) and crosstalk is low. Accordingly, forming the trap-rich layer 106 using an RTA enhances the SOI substrate being formed for use with RF applications and other applications.

Figure 10:
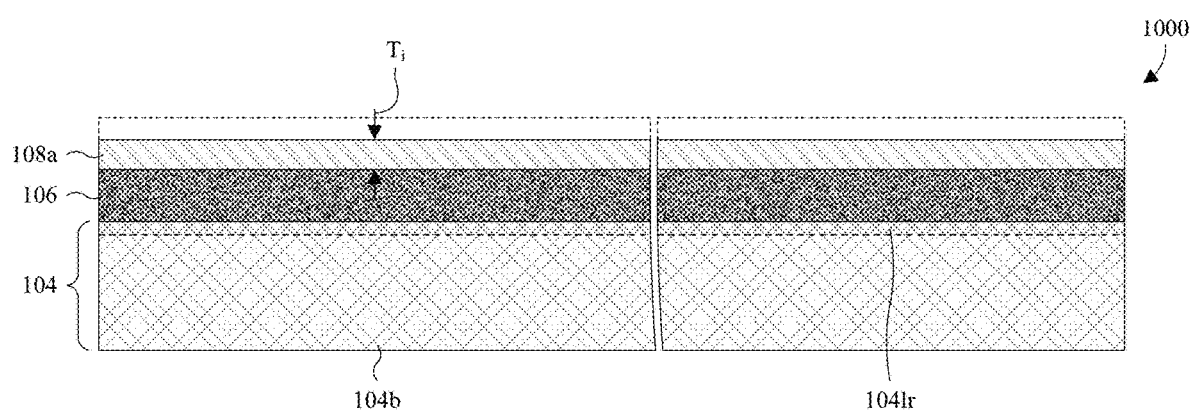

As illustrated by the cross-sectional view 1000 of FIG. 10, a first planarization is performed into the first insulating layer 108a. The first planarization reduces the thickness $T_i$ of the first insulating layer 108a. In some embodiments, the thickness $T_i$ is reduced to between about 0.1-2 micrometers, about 0.1-1.25 micrometers, or about 1.25-2.0 micrometers. The first planarization also reduces the TTV of the first insulating layer 108a. In some embodiments, the TTV is reduced to less than about 10, 25, or 50 nanometers. Because the TTV is low before the planarization (as discussed with regard to FIG. 9), the first planarization may remove a minimal amount of material to achieve a desired TTV, thereby reducing costs. The first planarization may, for example, be performed by a chemical mechanical polish (CMP) or some other planarization process.

Figure 11:
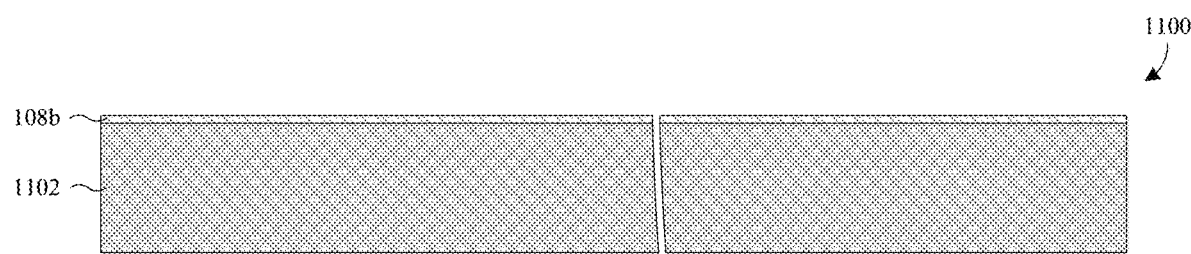

As illustrated by the cross-sectional view 1100 of FIG. 11, a device substrate 1102 is provided. In some embodiments, the device substrate 1102 has a circular top layout and/or has a diameter of about 200, 300, or 450 millimeters. In other embodiments, the device substrate 1102 has some other shape and/or some other dimensions. In some embodiments, the device substrate 1102 has the same top layout as the high-resistivity substrate 104 (see FIG. 10) and/or is a semiconductor wafer (e.g., a bulk silicon wafer). In some embodiments, the device substrate 1102 has a low resistance compared to the high-resistivity substrate 104, and/or is or comprises the same semiconductor material as the high-resistivity substrate 104. The device substrate 1102 may be or comprise, for example, monocrystalline silicon, some other silicon material, some other semiconductor material, or any combination of the foregoing.

Also illustrated by the cross-sectional view 1100 of FIG. 11, a second insulating layer 108b is formed on the device substrate 1102. In some embodiments, the second insulating layer 108b is the same material as the first insulating layer 108a (see FIG. 10). The second insulating layer 108b may, for example, be silicon oxide, silicon nitride, some other dielectric, or any combination of the foregoing. Further, the first insulating layer 108a may, for example, be formed by CVD, PVD, thermal oxidation, or some other deposition process.

Figure 12:
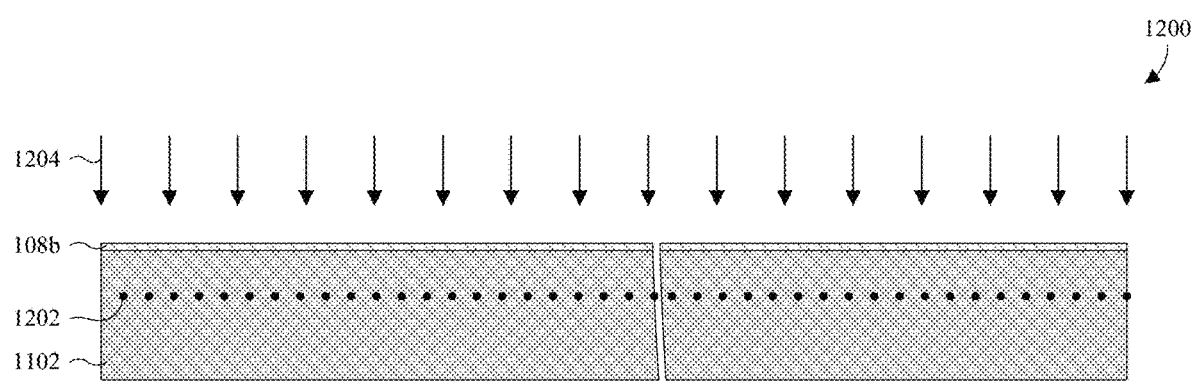

As illustrated by the cross-sectional view 1200 of FIG. 12, an ion-rich layer 1202 is formed completely buried in the device substrate 1102. As seen hereafter the depth to which the ion-rich layer 1202 is buried effects the thickness of a device layer being formed. Ions of the ion-rich layer may, for example, be or comprise hydrogen ions and/or some other ions. In some embodiments, the ion-rich layer 1202 is formed by ion implantation of ions 1204 into the device substrate 1102.

Figure 13:
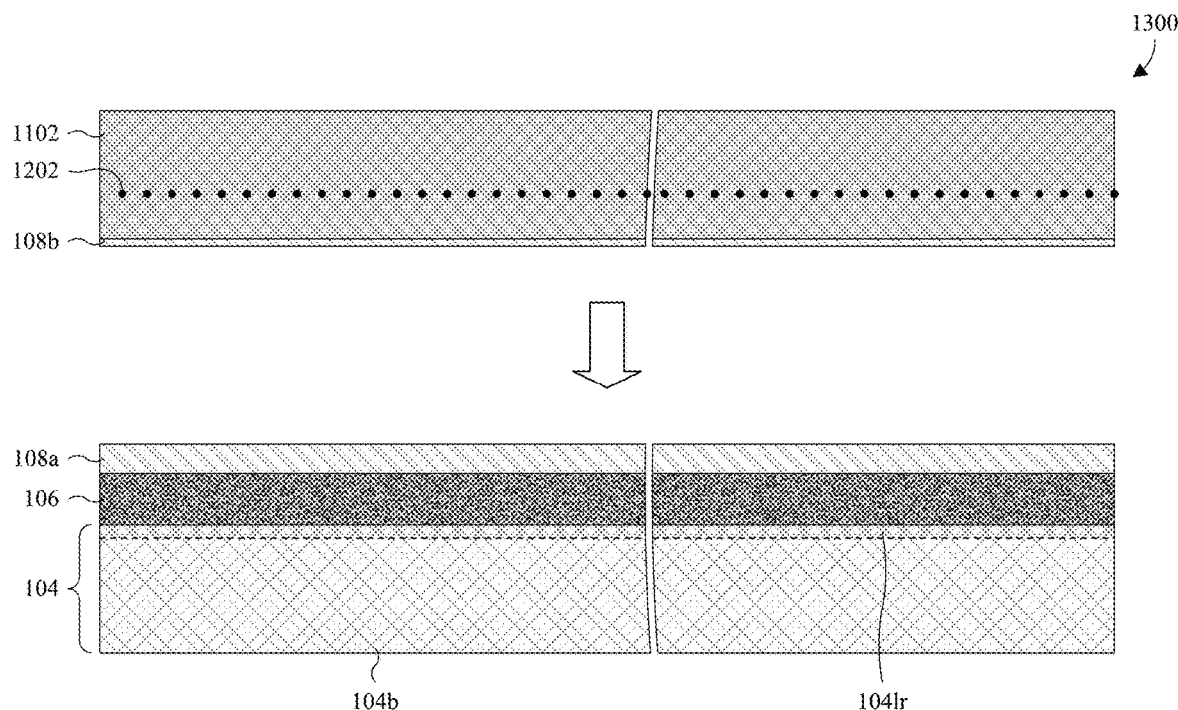

As illustrated by the cross-sectional view 1300 of FIG. 13, the device substrate 1102 and the second insulating layer 108b are flipped vertically and bonded to the first insulating layer 108a, such that the first and second insulating layers 108a, 108b are sandwiched between the trap-rich layer 106 and the device substrate 1102. The bonding may, for example, be performed by fusion bonding or some other bonding process.

Figure 14:
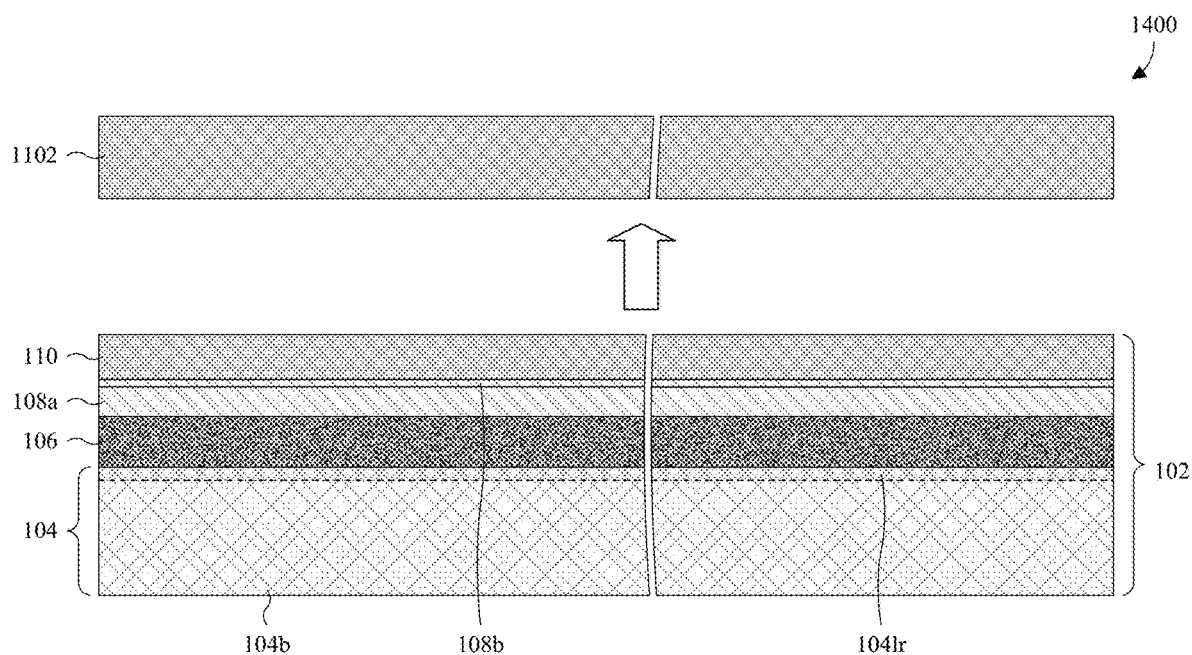

As illustrated by the cross-sectional view 1400 of FIG. 14, the device substrate 1102 is cleaved along the ion-rich layer 1202, thereby leaving a portion of the device substrate 1102 (hereafter the device layer 110) bonded to the first insulating layer 108a. Collectively, the high-resistivity substrate 104, the trap-rich layer 106, the first and second insulating layers 108a, 108b, and the device layer 110 define an SOI substrate 102. In some embodiments, a process for cleaving the device substrate 1102 comprises annealing. The annealing causes micro voids (or bubbles) to form at the ion-rich layer 1202 (see FIG. 13), thereby cleaving the device substrate 1102 along the ion-rich layer 1202. Further, the annealing strengths the bond between the first and second insulating layers 108a, 108b.

Figure 15:
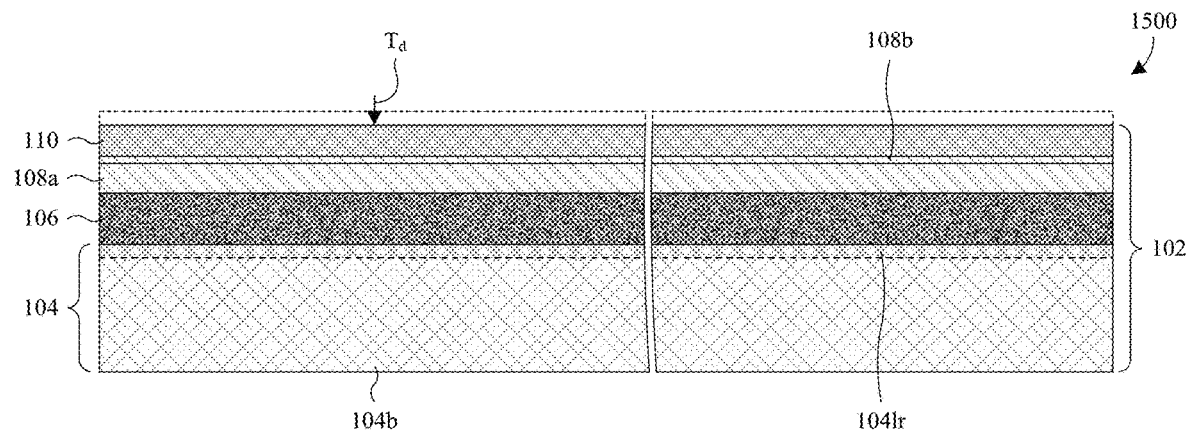

As illustrated by the cross-sectional view 1500 of FIG. 15, a second planarization is performed into the device layer 110. The first planarization reduces a thickness $T_d$ of the device layer 110, and also reduces a TTV of the device layer 110. The second planarization may, for example, be performed by a CMP or some other planarization process.

Figure 16:
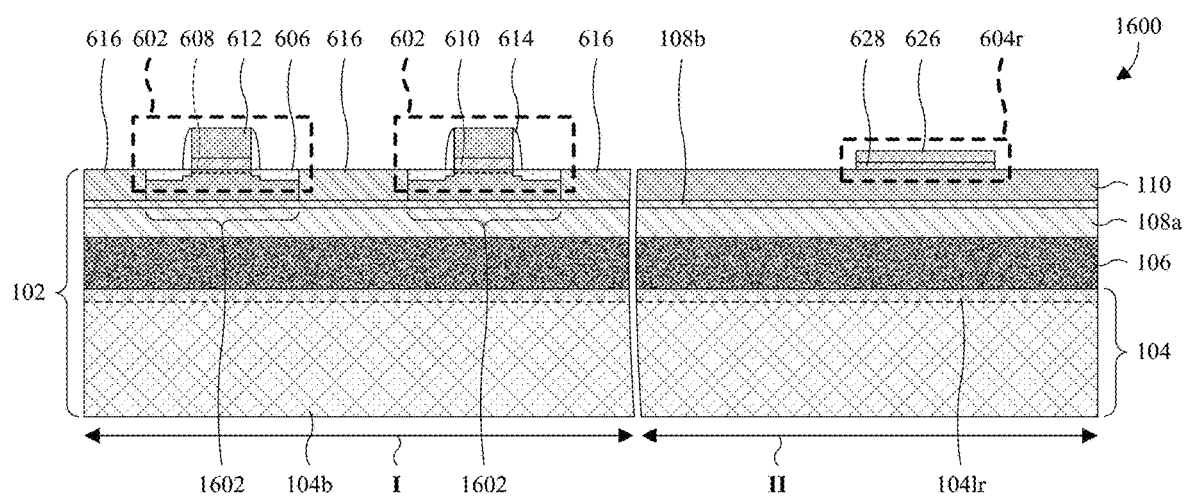

As illustrated by the cross-sectional view 1600 of FIG. 16, devices are formed on the SOI substrate 102. In some embodiments, active devices 602 are formed on the SOI substrate 102, at a first portion I of a semiconductor structure being formed. Further, in some embodiments, a passive resistor 604r is formed on the SOI substrate 102, at a second portion II of the semiconductor structure being formed.

The active devices 602 are laterally spaced over and partially defined by the device layer 110. The active devices 602 may be, for example, MOSFETs, some other MOS devices, some other semiconductor devices, or any combination of the foregoing. In some embodiments, the active devices 602 comprise corresponding source/drain regions 606, corresponding selectively-conductive channels 608, corresponding gate dielectric layers 610, corresponding gate electrodes 612, and corresponding spacers 614. For ease of illustration, only one of the source/drain regions 606 is labeled 606, only one of the selectively-conductive channels 608 is labeled 608, only one of the gate dielectric layers 610 is labeled 610, only one of the gate electrodes 612 is labeled 612, and only one of the spacers 614 is labeled 614. The source/drain regions 606 and the selectively-conductive channels 608 are in the device layer 110. The source/drain regions 606 are respectively at ends of the selectively-conductive channels 608, and each of the selectively-conductive channels 608 extends from one of the source/drain regions 606 to another one of the source/drain regions 606. The gate dielectric layers 610 respectively overlie the selectively-conductive channels 608, and the gate electrodes 612 respectively overlie the gate dielectric layers 610. The spacers 614 overlie the source/drain regions 606 and respectively line sidewalls of the gate electrodes 612.

In some embodiments where the gate dielectric layers 610 are or comprise oxide, GOI of the gate dielectric layers 610 is high. The gate dielectric layers 610 may have high GOI due to formation of the trap-rich layer 106 by RTA. As described above, the RTA reduces substrate warpage, which improves GOI. The improved GOI may, for example, enhance yields during bulk manufacture of the active devices 602.

In some embodiments, a process for forming the active devices 602 comprises forming isolation structures 616 in the device layer 110, demarcating device regions 1602 individual to the active devices 602. The isolation structures 616 may be or comprise, for example, STI structures, DTI structures, some other trench isolation structures, or some other isolation structure. Thereafter, a dielectric layer is deposited covering device layer 110, and a conductive layer is deposited covering the dielectric layer. The conductive layer and the dielectric layer are patterned (e.g., by a photolithography/etching process) into the gate electrodes 612 and the gate dielectric layers 610. Dopants are implanted into the device regions 1602 with the gate electrodes 612 in place to define lightly doped portions of the source/drain regions 606, and a spacer layer is formed covering the source/drain regions 606 and the gate electrodes 612. The spacer layer is etched back to form the spacers 614, and dopants are implanted into the device regions 1602 with the spacers 614 in place to expand the source/drain regions 606.

The passive resistor 604r comprises a resistive layer 626 and a resistor dielectric layer 628 stacked on the device layer 110. In some embodiments, a process for forming the passive resistor 604r comprises depositing the resistor dielectric layer 628 covering the device layer 110, and further depositing the resistive layer 626 covering the resistor dielectric layer 628. In some embodiments, the resistor dielectric layer 628 and the dielectric layer used to form the gate dielectric layers 610 are one and the same. Thereafter, the resistor dielectric layer 628 and the resistive layer 626 are patterned (e.g., by a photolithography/etching process) into the passive resistor 604r.

Figure 17:
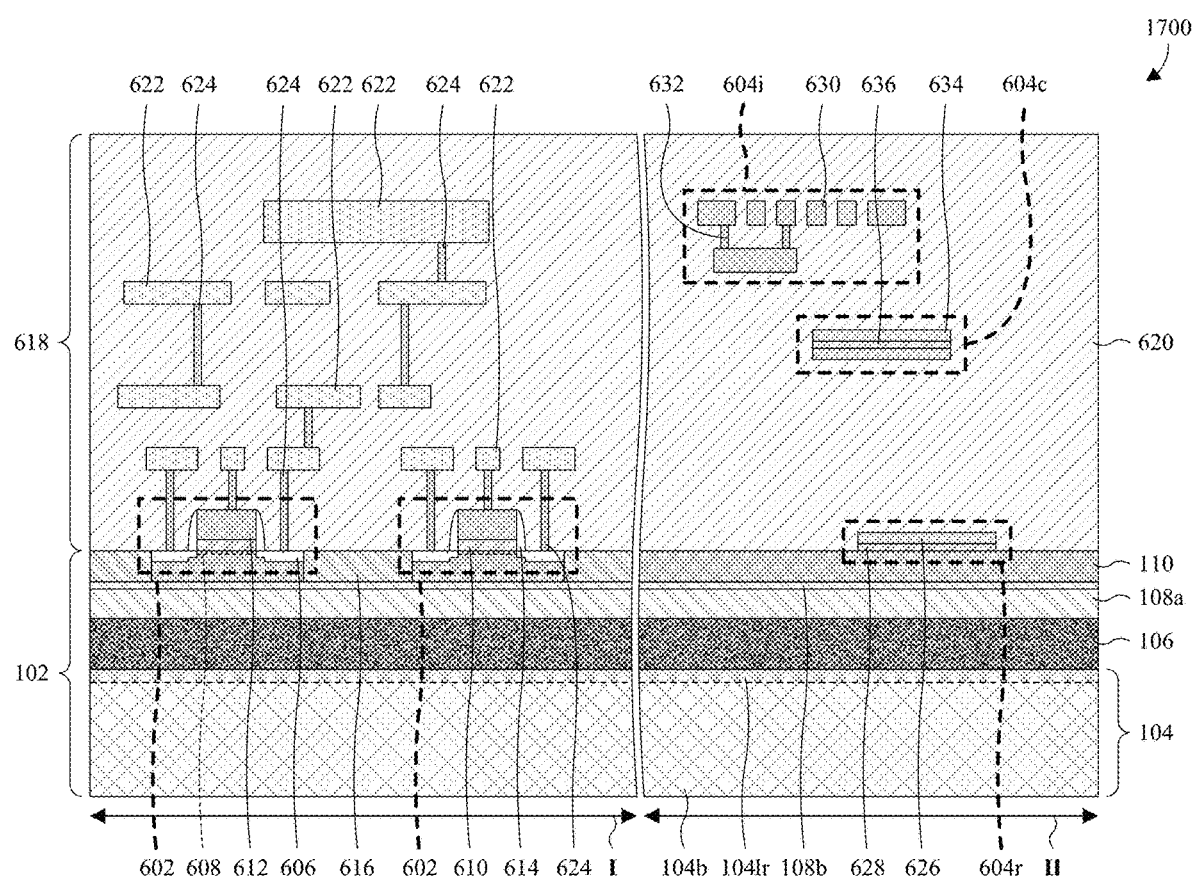

As illustrated by the cross-sectional view 1700 of FIG. 17, a BEOL interconnect structure 618 is formed over the device layer 110. The BEOL interconnect structure 618 comprises an interconnect dielectric layer 620, a plurality of wires 622, and a plurality of vias 624. For ease of illustration, only some of the wires 622 are labeled 622, and only some of the vias 624 are labeled 624. The wires 622 and the vias 624 are alternatingly stacked in the interconnect dielectric layer 620 and define conductive paths interconnect devices (e.g., the active devices 602) on the SOI substrate 102.

In some embodiments, a process for forming the BEOL interconnect structure 618 comprises forming a bottommost layer of the vias 624 by a single damascene process, and subsequently forming a bottommost layer of the wires 622 by the single damascene process. Further, in some embodiments, the process comprises forming remaining layers of the vias 624 and remaining layers of the wires 622 by repeatedly performing a dual damascene process. In some embodiments, the single damascene process comprises depositing a portion of the interconnect dielectric layer 620, patterning the interconnect dielectric layer 620 with openings for a single layer of conductive features (e.g., a layer of vias or a layer of wires), and filling the openings with conductive material to form the single layer of conductive features. In some embodiments, the dual damascene process comprises depositing a portion of the interconnect dielectric layer, patterning the interconnect dielectric layer 620 with openings for two layers of conductive features (e.g., a layer of vias and a layer of wires), and filling the openings with conductive material to form the two layers of conductive features.

Also illustrated by the cross-sectional view 1700 of FIG. 17, a passive inductor 604i is formed in the BEOL interconnect structure 618. The passive inductor 604i comprises one or more inductor wires 630. For ease of illustration, only one of the inductor wire(s) 630 is labeled 630. In some embodiments, the inductor wire(s) 630 span multiple heights above the SOI substrate 102 and the passive inductor 604i comprises one or more inductor vias 632 interconnecting the inductor wire(s) 630 across the multiple heights. For ease of illustration, only one of the inductor via(s) 632 is labeled 632. The passive inductor 604i may, for example, be formed with the vias 624 and the wires 622. Further, the passive inductor 604i may, for example, be formed in the same manner as the vias 624 and/or the wires 622, and/or may, for example, be formed using a single damascene process and/or a dual damascene process.

Also illustrated by the cross-sectional view 1700 of FIG. 17, a passive capacitor 604c is formed in the BEOL interconnect structure 618. The passive capacitor 604c comprises a pair of capacitor plates 634 and a capacitor dielectric layer 636. For ease of illustration, only one of the capacitor plates 634 is labeled 634. The capacitor plates 634 and the capacitor dielectric layer 636 are stacked with the capacitor dielectric layer 636 between the capacitor plates 634. The passive capacitor 604c is formed after the BEOL interconnect structure 618 is partially formed. In some embodiments, a process for forming the passive capacitor 604c comprises depositing a first plate layer over the partially formed BEOL interconnect structure 618, depositing a capacitor dielectric layer over the first plate layer, and depositing a second plate layer over the capacitor dielectric layer. The first and second plate layers and the capacitor dielectric layer are then patterned (e.g., by a photolithography/etching process) into the passive capacitor 604c, and formation of the BEOL interconnect structure 618 resumes.

While FIGS. 7-17 illustrate formation of the SOI substrate 102 using cleaving of the device substrate 1102, it is to be appreciated that other approaches to forming the SOI substrate 102 are amenable in other embodiments. However, in such other embodiments, the trap-rich layer 106 is still formed as illustrated and described with regard to FIGS. 7 and 8. Additionally, while FIGS. 16 and 17 illustrate the formation of devices (e.g., the passive capacitor 604c) on the SOI substrate 102, one, some, or all of these devices may be omitted. Similarly, while FIGS. 16 and 17 illustrate the formation of certain device types on the SOI substrate 102, other device types may be formed on the SOI substrate 102.

Figure 18:
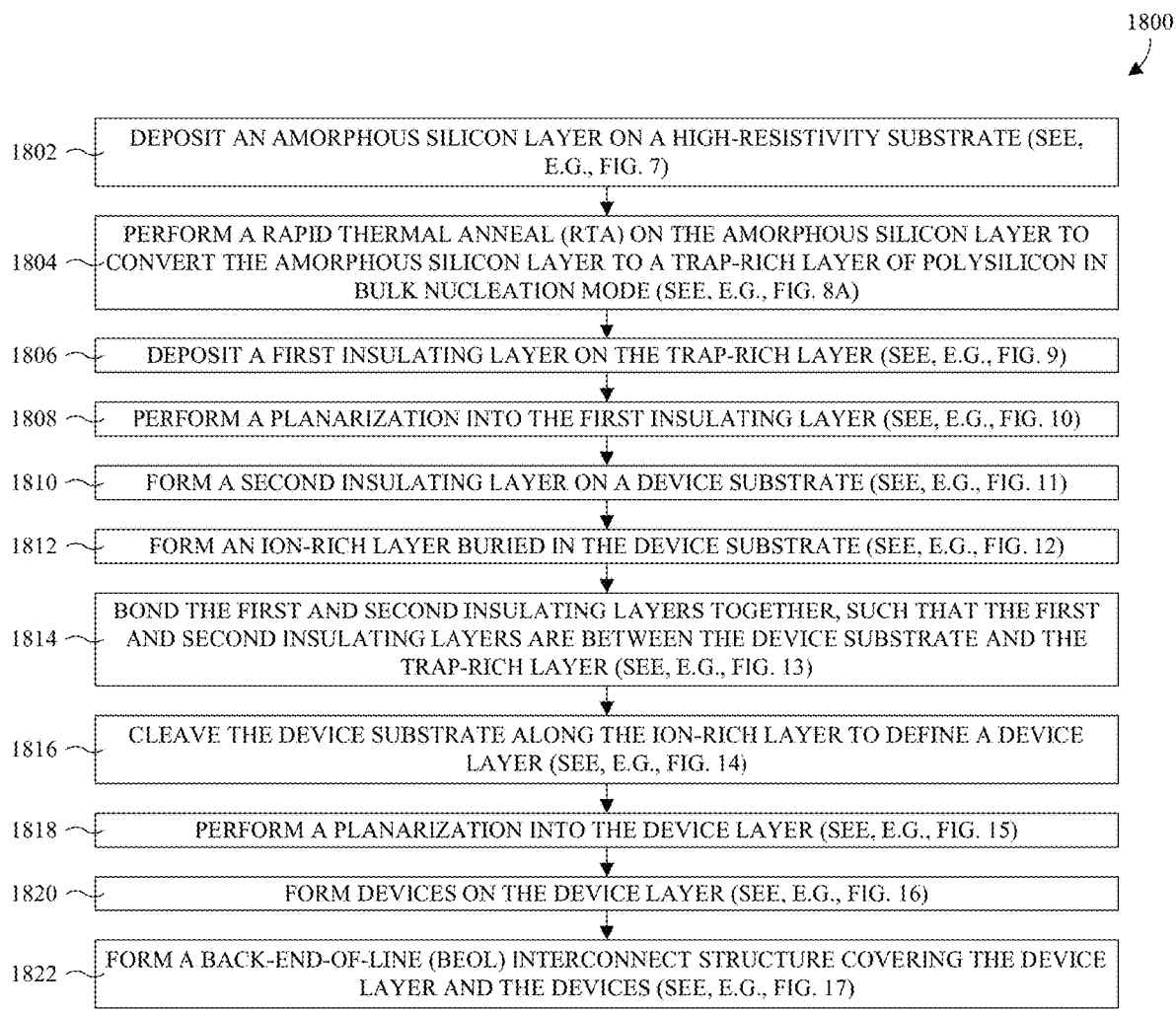
FIG. 18 illustrates a block diagram of some embodiments of the method of FIGS. 7, 8A, and 9-17.

With reference to FIG. 18, a block diagram 1800 of some embodiments of the method of FIGS. 7, 8A, and 9-17 is provided.

At 1802, an amorphous silicon layer is deposited on a high-resistivity substrate. See, for example, FIG. 7.

At 1804, RTA is performed on the amorphous silicon layer to convert the amorphous silicon layer to a trap-rich layer of polysilicon in bulk nucleation mode. See, for example, FIG. 8A. By crystallizing the amorphous silicon layer in bulk nucleation mode, the trap-rich layer is formed with a high percentage of equiaxed grains and a low percentage of columnar grains. The columnar grains are large elongated grains, such that the columnar grains have a low grain boundary area and a low trap density. The equiaxed grains are small grains with approximately equal dimensions, such that the equiaxed grains have a high grain boundary area and a high trap density.

Because small grains make up a large percentage of the trap-rich layer, the stress imposed on the high-resistivity substrate by the trap-rich layer is low and substrate warpage is low. This, in turn, reduces dislocations and/or slips at edges of the high-resistivity substrate, and enhances GOI for devices hereafter formed. The former may enhance yields when forming the SOI substrate in bulk, whereas the latter may enhance yields when forming devices on the SOI substrate in bulk.

Because the equiaxed grains make up a large percentage of the trap-rich layer, the trap-rich layer has high grain boundary area and a high density of carrier traps. The carrier traps trap mobile electrons that cause PSC in the high-resistivity substrate, thereby minimizing PSC. By minimizing PSC, RF losses may be low and passive devices on the SOI substrate may have high Q factors. Further, linearity may be high (e.g., second harmonics may be low) and crosstalk may be low. Accordingly, the trap-rich layer enhances the SOI substrate for use with RF applications and other applications.

At 1806, a first insulating layer is deposited on the trap-rich layer. See, for example, FIG. 9.

At 1808, a planarization is performed into the first insulating layer. See, for example, FIG. 10. Because a large percentage of the trap-rich layer is small equiaxed grains, a top surface of the trap-rich layer is relatively smooth. This results in the first insulating layer having a thickness that is substantially uniform and a TTV that is low. Further, because the TTV is low before the planarization, the first planarization may remove a minimal amount of material from the first insulating layer to achieve a desired TTV, thereby reducing costs.

At 1810, a second insulating layer is formed on a device substrate. See, for example, FIG. 11.

At 1812, an ion-rich layer is formed buried in the device substrate. See, for example, FIG. 12.

At 1814, the first and second insulating layers are bonded together, such that the first and second insulating layers are between the device substrate and the trap-rich layer. See, for example, FIG. 13.

At 1816, the device substrate is cleaved along the ion-rich layer to define a device layer. See, for example, FIG. 14.

At 1818, a planarization is performed into the device layer. See, for example, FIG. 15.

At 1820, devices are formed on the device layer. See, for example, FIG. 16.

At 1822, a BEOL interconnect structure is formed covering the device layer and the devices. See, for example, FIG. 17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides a method for forming an SOI substrate, the method including: depositing an amorphous silicon layer on a high-resistivity substrate; performing a RTA to crystallize the amorphous silicon layer into a trap-rich layer of polysilicon in which a majority of grains are equiaxed; forming an insulating layer over the trap-rich layer; and forming a device layer over the insulating layer, wherein the device layer includes a semiconductor material. In some embodiments, the performing of the RTA includes ramping up heating of the amorphous silicon layer at a ramp-up rate above about 75 degrees Celsius per second until a high temperature above about 600 degrees Celsius is reached. In some embodiments, the performing of the RTA includes ramping down heating of the amorphous silicon layer after heating the amorphous silicon layer for a short period of time less than about 10 seconds. In some embodiments, the RTA forms the trap-rich layer with a high percentage of equiaxed grains, and wherein the high percentage is greater than about 80% by total number of grains. In some embodiments, the method further includes forming a barrier oxide layer over the high-resistivity substrate, wherein the amorphous silicon layer is deposited over the barrier oxide layer by an epitaxy tool. In some embodiments, the amorphous silicon layer is deposited on the high-resistivity substrate and multiple other high-resistivity substrates at the same time within a multi-substrate process tool. In some embodiments, the forming of the insulating layer includes: depositing the insulating layer on the trap-rich layer; and performing a planarization into the insulating layer. In some embodiments, the forming of the device layer includes: depositing a second insulating layer on a device substrate; implanting ions into the device substrate through the second insulating layer to form an ion-rich layer buried in the device substrate; bonding the second insulating layer to the insulating layer, such that the insulating layer and the second insulating layer are between the device substrate and the trap-rich layer; and cleaving the device substrate along the ion-rich layer to remove a portion of the device substrate, wherein a remaining portion of the device substrate defines the device layer. In some embodiments, the method further includes forming a low-resistivity region in the high-resistivity substrate, along a top surface of the high-resistivity substrate, while formed by the insulating layer, wherein the low-resistivity region has a low resistance compared to a bulk of the high-resistivity substrate.

In some embodiments, the present application provides a SOI substrate, including: a high-resistivity substrate; a trap-rich layer overlying the high-resistivity substrate, wherein the trap-rich layer includes polysilicon in which a majority of grains are equiaxed; an insulating layer over the trap-rich layer; and a device layer over the insulating layer, wherein the device layer includes a semiconductor material. In some embodiments, at least about 80% of polysilicon grains in the trap-rich layer are equiaxed grains. In some embodiments, less than about 20% of polysilicon grains in the trap-rich layer are columnar grains. In some embodiments, the majority of grains have maximum dimensions less than about 100 nanometers. In some embodiments, the high-resistivity substrate includes a low-resistivity region and a bulk semiconductor region, wherein the bulk semiconductor region underlies the low-resistivity region and has a high resistance greater than that of the low-resistivity region. In some embodiments, the high-resistivity substrate has a high resistance greater than about 1 kΩ/cm. In some embodiments, the SOI substrate further includes a dielectric barrier layer between the high-resistivity substrate and the trap-rich layer.

In some embodiments, the present application provides a method for forming a semiconductor structure, the method including: depositing an amorphous silicon layer on a high-resistance substrate; heating the amorphous silicon layer to crystallize the amorphous silicon layer into a trap-rich layer of polysilicon, wherein the heating follows a spiked temperature curve; forming an insulating layer over the trap-rich layer; and forming a device layer over the insulating layer, wherein the device layer includes a semiconductor material. In some embodiments, the heating includes ramping up temperature at a ramp-up rate above about 75 degrees Celsius per second until a high temperature above about 600 degrees Celsius is reached. In some embodiments, the heating forms the trap-rich layer with a high percentage of equiaxed grains and a low percentage of columnar grains, wherein the high percentage is greater than about 80% by total number of grains, and wherein the low percentage is less than about 20% by total number of grains. In some embodiments, the method further includes: forming a semiconductor device overlying and partially defined by the device layer; and forming an interconnect structure covering the semiconductor device and the device layer, wherein the interconnect structure includes an alternating stack of wires and vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor-on-insulator (SOI) substrate, the method comprising:
   depositing an amorphous silicon layer on a high-resistivity substrate;
   performing a rapid thermal anneal (RTA) to crystallize the amorphous silicon layer into a trap-rich layer of polysilicon in which a majority of grains are equiaxed;
   forming an insulating layer over the trap-rich layer; and
   forming a device layer over the insulating layer, wherein the device layer comprises a semiconductor material;
   wherein the insulating layer comprises fixed charge attracting mobile carriers in the high-resistivity substrate, wherein grain boundaries of the trap-rich layer define carrier traps trapping the mobile carriers, wherein the RTA forms the trap-rich layer with a high percentage of equiaxed grains, and wherein the high percentage is greater than about 80% by total number of grains.

2. The method according to claim 1, wherein the performing of the RTA comprises:
   ramping up heating of the amorphous silicon layer at a ramp-up rate above about 75 degrees Celsius per second until a high temperature above about 600 degrees Celsius is reached.

3. The method according to claim 2, wherein the performing of the RTA comprises:
   ramping down heating of the amorphous silicon layer after heating the amorphous silicon layer for a short period of time less than about 10 seconds.

4. The method according to claim 1, further comprising:
   forming a barrier oxide layer over the high-resistivity substrate, wherein the amorphous silicon layer is deposited over the barrier oxide layer by an epitaxy tool.

5. The method according to claim 1, wherein the amorphous silicon layer is deposited on the high-resistivity substrate and multiple other high-resistivity substrates at the same time within a multi-substrate process tool.

6. The method according to claim 1, wherein the forming of the insulating layer comprises:
depositing the insulating layer on the trap-rich layer; and
performing a planarization into the insulating layer.

7. The method according to claim 1, wherein the forming of the device layer comprises:
depositing a second insulating layer on a device substrate;
implanting ions into the device substrate through the second insulating layer to form an ion-rich layer buried in the device substrate;
bonding the second insulating layer to the insulating layer, such that the insulating layer and the second insulating layer are between the device substrate and the trap-rich layer; and
cleaving the device substrate along the ion-rich layer to remove a portion of the device substrate, wherein a remaining portion of the device substrate defines the device layer.

8. The method according to claim 1, further comprising:
forming a low-resistivity region in the high-resistivity substrate, along a top surface of the high-resistivity substrate, while forming the insulating layer, wherein the low-resistivity region has a low resistance compared to a bulk of the high-resistivity substrate, and wherein the low-resistivity region forms from the mobile carriers being attracted to the low-resistivity region by the fixed charge.

9. A semiconductor-on-insulator (SOI) substrate, comprising:
a high-resistivity substrate;
a trap-rich layer overlying the high-resistivity substrate, wherein the trap-rich layer comprises polysilicon in which a majority of grains are equiaxed, and wherein at least about 80% of polysilicon grains in the trap-rich layer are equiaxed grains;
an insulating layer over the trap-rich layer; and
a device layer over the insulating layer, wherein the device layer comprises a semiconductor material.

10. The SOI substrate according to claim 9, wherein less than about 20% of polysilicon grains in the trap-rich layer are columnar grains.

11. The SOI substrate according to claim 9, wherein the majority of grains have maximum dimensions less than about 100 nanometers.

12. The SOI substrate according to claim 9, wherein the high-resistivity substrate comprises a low-resistivity region and a bulk semiconductor region, and wherein the bulk semiconductor region underlies the low-resistivity region and has a high resistance greater than that of the low-resistivity region.

13. The SOI substrate according to claim 12, wherein the high-resistivity substrate has a high resistance greater than about 1 kilo-ohms/centimeter (kΩ/cm).

14. The SOI substrate according to claim 9, further comprising:
a dielectric barrier layer between the high-resistivity substrate and the trap-rich layer.

15. A method for forming a semiconductor structure, the method comprising:
depositing an amorphous silicon layer over and directly contacting a high-resistance semiconductor substrate;
heating the amorphous silicon layer to crystallize the amorphous silicon layer into a trap-rich layer of polysilicon, wherein the heating follows a spiked temperature curve;
forming an insulating layer over the trap-rich layer; and
forming a device layer over the insulating layer, wherein the device layer comprises a semiconductor material;
wherein the heating forms the trap-rich layer with a high percentage of equiaxed grains and a low percentage of columnar grains, wherein the high percentage is greater than about 80% by total number of grains, and wherein the low percentage is less than about 20% by total number of grains.

16. The method according to claim 15, wherein the heating comprises ramping up temperature at a ramp-up rate above about 75 degrees Celsius per second until a high temperature above about 600 degrees Celsius is reached.

17. The method according to claim 15, further comprising:
forming a semiconductor device overlying and partially defined by the device layer; and
forming an interconnect structure covering the semiconductor device and the device layer, wherein the interconnect structure comprises an alternating stack of wires and vias.

18. The method according to claim 15, wherein the heating ramps down after a short period of time less than about 10 seconds.

19. The method according to claim 15, wherein the amorphous silicon layer is deposited on the high-resistivity semiconductor substrate and multiple other high resistivity semiconductor substrates at the same time within a multi-substrate process tool.

20. The method according to claim 15, wherein the forming of the insulating layer comprises: depositing the insulating layer on the trap-rich layer; and performing a planarization into the insulating layer.

* * * * *